(12) United States Patent
Gilton et al.

(10) Patent No.: US 6,847,535 B2
(45) Date of Patent: Jan. 25, 2005

(54) REMOVABLE PROGRAMMABLE CONDUCTOR MEMORY CARD AND ASSOCIATED READ/WRITE DEVICE AND METHOD OF OPERATION

(75) Inventors: Terry L. Gilton, Boise, ID (US); Trung T. Doan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 134 days.

(21) Appl. No.: 10/077,784

(22) Filed: Feb. 20, 2002

(65) Prior Publication Data

US 2003/0156467 A1 Aug. 21, 2003

(51) Int. Cl.[7] .............................. G11C 5/02; G11C 5/06
(52) U.S. Cl. .............................. 365/51; 365/52; 365/63
(58) Field of Search .............................. 365/51, 52, 63, 365/189.01; 438/95, 650; 701/200

(56) References Cited

U.S. PATENT DOCUMENTS

| 3,622,319 A | 11/1971 | Sharp |
| 3,743,847 A | 7/1973 | Boland |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,671,618 A | 6/1987 | Wu et al. |
| 4,795,657 A | 1/1989 | Formigoni et al. |
| 4,800,526 A | 1/1989 | Lewis |
| 4,847,674 A | 7/1989 | Sliwa et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,314,772 A | 5/1994 | Kozicki |
| 5,315,131 A | 5/1994 | Kishimoto et al. |
| 5,350,484 A | 9/1994 | Gardner et al. |
| 5,360,981 A | 11/1994 | Owen et al. |
| 5,500,532 A | 3/1996 | Kozicki et al. |
| 5,512,328 A | 4/1996 | Yoshimura |
| 5,512,773 A | 4/1996 | Wolf et al. |
| 5,515,284 A | * 5/1996 | Abe .......................... 701/200 |
| 5,524,231 A | * 6/1996 | Brown ........................ 365/52 |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,814,527 A | 9/1998 | Wolstenholme et al. |
| 5,818,749 A | 10/1998 | Harshfield |
| 5,841,150 A | 11/1998 | Gonzalez et al. |

(List continued on next page.)

FOREIGN PATENT DOCUMENTS

| JP | 56126916 | 10/1981 |
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Abdel–Ali, A.; Elshafie, A.; Elhawary, M.M., DC electric–field effect in bulk and thin–film Ge5As38Te57 chalcogenide glass, Vacuum 59 (2000) 845–853.

(List continued on next page.)

Primary Examiner—Trong Phan
(74) Attorney, Agent, or Firm—Dickstein Shapiro Morin & Oshinsky LLP

(57) ABSTRACT

A removable memory card and an associated read/write device and its method of operation are disclosed. The memory card may be formed of a sheet of chalcogenide glass material which has memory storage locations therein defined by the locations of conductive read/write elements of the read/write device.

85 Claims, 8 Drawing Sheets

U.S. PATENT DOCUMENTS

| | | | |
|---|---|---|---|
| 5,846,889 A | 12/1998 | Harbison et al. | |
| 5,851,882 A | 12/1998 | Harshfield | |
| 5,869,843 A | 2/1999 | Harshfield | |
| 5,883,827 A | 3/1999 | Morgan | 365/63 |
| 5,896,312 A | 4/1999 | Kozicki et al. | |
| 5,914,893 A | 6/1999 | Kozicki et al. | |
| 5,920,788 A | 7/1999 | Reinberg | |
| 5,998,066 A | 12/1999 | Block et al. | |
| 6,031,287 A | 2/2000 | Harshfield | |
| 6,072,716 A | 6/2000 | Jacobson et al. | |
| 6,077,729 A | 6/2000 | Harshfield | |
| 6,084,796 A | 7/2000 | Kozicki et al. | |
| 6,117,720 A | 9/2000 | Harshfield | |
| 6,143,604 A | 11/2000 | Chiang et al. | |
| 6,177,338 B1 | 1/2001 | Liaw et al. | |
| 6,236,059 B1 | 5/2001 | Wolsteinholme et al. | |
| 6,297,170 B1 | 10/2001 | Gabriel et al. | |
| 6,300,684 B1 | 10/2001 | Gonzalez et al. | |
| 6,316,784 B1 | 11/2001 | Zahorik et al. | |
| 6,329,606 B1 | 12/2001 | Freyman et al. | |
| 6,348,365 B1 * | 2/2002 | Moore et al. | 438/95 |
| 6,350,679 B1 | 2/2002 | McDaniel et al. | |
| 6,376,284 B1 | 4/2002 | Gonzalez et al. | |
| 6,388,324 B2 | 5/2002 | Kozicki et al. | |
| 6,391,688 B1 | 5/2002 | Gonzalez et al. | |
| 6,414,376 B1 | 7/2002 | Thakur et al. | |
| 6,418,049 B1 | 7/2002 | Kozicki et al. | |
| 6,420,725 B1 | 7/2002 | Harshfield | |
| 6,423,628 B1 | 7/2002 | Li et al. | |
| 6,440,837 B1 | 8/2002 | Harshfield | |
| 6,469,364 B1 | 10/2002 | Kozicki | |
| 6,473,332 B1 | 10/2002 | Ignatiev et al. | |
| 6,487,106 B1 | 11/2002 | Kozicki | |
| 6,511,906 B1 * | 1/2003 | Sinha | 438/650 |
| 2002/0000666 A1 | 1/2002 | Kozicki et al. | |
| 2002/0072188 A1 | 6/2002 | Gilton | |
| 2002/0106849 A1 | 8/2002 | Moore | |
| 2002/0123169 A1 | 9/2002 | Moore et al. | |
| 2002/0123170 A1 | 9/2002 | Moore et al. | |
| 2002/0123248 A1 | 9/2002 | Moore et al. | |
| 2002/0127886 A1 | 9/2002 | Moore et al. | |
| 2002/0132417 A1 | 9/2002 | Li | |
| 2002/0160551 A1 | 10/2002 | Harshfield | |
| 2002/0163828 A1 | 11/2002 | Krieger et al. | |
| 2002/0168820 A1 | 11/2002 | Kozicki | |
| 2002/0168852 A1 | 11/2002 | Harshfield et al. | |
| 2002/0190289 A1 | 12/2002 | Harshfield et al. | |
| 2002/0190350 A1 | 12/2002 | Kozicki et al. | |
| 2003/0001229 A1 | 1/2003 | Moore et al. | |
| 2003/0027416 A1 | 2/2003 | Moore | |
| 2003/0032254 A1 | 2/2003 | Gilton | |
| 2003/0035314 A1 | 2/2003 | Kozicki | |
| 2003/0035315 A1 | 2/2003 | Kozicki | |
| 2003/0038301 A1 | 2/2003 | Moore | |
| 2003/0043631 A1 | 3/2003 | Gilton et al. | |
| 2003/0045049 A1 | 3/2003 | Campbell et al. | |
| 2003/0045054 A1 | 3/2003 | Campbell et al. | |
| 2003/0047765 A1 | 3/2003 | Campbell | |
| 2003/0047772 A1 | 3/2003 | Li | |
| 2003/0047773 A1 | 3/2003 | Li | |
| 2003/0048519 A1 | 3/2003 | Kozicki | |
| 2003/0049912 A1 | 3/2003 | Campbell et al. | |
| 2003/0068861 A1 | 4/2003 | Li | |
| 2003/0068862 A1 | 4/2003 | Li | |
| 2003/0095426 A1 | 5/2003 | Hush et al. | |
| 2003/0096497 A1 | 5/2003 | Moore et al. | |
| 2003/0107105 A1 | 6/2003 | Kozicki | |
| 2003/0117831 A1 | 6/2003 | Hush | |
| 2003/0128612 A1 | 7/2003 | Moore et al. | |
| 2003/0137869 A1 | 7/2003 | Kozicki | |
| 2003/0143782 A1 | 7/2003 | Gilton et al. | |
| 2003/0155606 A1 | 8/2003 | Campbell et al. | |
| 2003/0156447 A1 | 8/2003 | Kozicki | |
| 2003/0156463 A1 | 8/2003 | Casper et al. | |

OTHER PUBLICATIONS

Adler, D.; Moss, S.C., Amorphous memories and bistable switches, J. Vac. Sci. Technol. 9 (1972) 1182–1189.

Adler, D.; Henisch, H.K.; Mott, S.N., The mechanism of threshold switching in amorphous alloys, Rev. Mod. Phys. 50 (1978) 209–220.

Afifi, M.A.; Labib, H.H.; El–Fazary, M.H.; Fadel, M., Electrical and thermal properties of chalcogenide glass system Se75Ge25–xSbx, Appl. Phys. A 55 (1992) 167–169.

Afifi, M.A.; Labib, H.H.; Fouad, S.S.; El–Shazly, A.A., Electrical & thermal conductivity of the amorphous semiconductor GexSe1–x, Egypt, J. Phys. 17 (1986) 335–342.

Alekperova, Sh.M.; Gadzhleva, G.S., Current–Voltage characerisitics of Ag2Se single cyrstal near the phase transition, Inorganic Materials 23 (1987) 137–139.

Aleksiejunas, A.; Cesnys, A., Switching phenomenon and memory effect in thin–film heterojunction of polycrystalline selenium–silver selenide, Phys. Stat. Sol. (a) 19 (1973) K169–K171.

Angell, C.A., Mobile ions in amorphous solids, Annu. Rev. Phys. Chem. 43 (1992) 693–717.

Aniya, M., Average electronegativity, medium–range–order, and ionic conductivity in superionic glasses, Solid state Ionics 136–137 (2000) 1085–1089.

Asahara, Y.; Izumitani, T., Voltage controlled switching in Cu–As–Se compositions, J. Non–Cryst. Solids 11 (1972) 97–104.

Asokan, S.; Prasad, M.V.N.; Parthasarathy, G.; Gopal, E.S.R., Mechanical and chemical thresholds in IV–VI chalcogenide glasses, Phys. Rev. Lett. 62 (1989) 808–810.

Baranovskii, S.D.; Cordes, H., On the conduction mechanism in Ionic glasses, J. Chem. Phys. 111 (1999) 7546–7557.

Belin, R.; Taillades, G.; Pradel, A.; Ribes, M., Ion dynamics in superionic chalcogenide glasses: complete conductivity spectra, Solid state Ionics 136–137 (2000) 1025–1029.

Belin, R.; Zerouale, A.; Pradel, A.; Ribes, M., Ion dynamics in the argyrodite compound Ag7GeSe5I: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M–Ag2Se–M, Thin solid films 70 (1980) L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sol. (a) 57 (1980) K101–K104.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't, E.; El Bouchalri, B.; Goureaux, G., Polarized memory switching effects in Ag2Se/Se/M thin film sandwiches, Thin solid films 97 (1982) 165–171.

Bernede, J.C.; Khelil, A.; Kettaf, M.; Conan, A., Transition from S– to N–type differential negative resistance in Al–Al2O3–Ag2–xSe1+x thin film structures, Phys. Stat. Sol. (a) 74 (1982) 217–224.

Bondarev, V.N.; Pikhitsa, P.V., A dendrite model of current instability in RbAg4I5, Solid State Ionics 70/71 (1994) 72–76.

Boolchand, P., The maximum in glass transition temperature (Tg) n ar x=1/3 In. G xSe1–x Glasses, Asian Journal of Physics (2000), 9, 709–72.

Boolchand, P.; Bresser, W.J., Mobile silver ions and glass formation in solid electrolytes, Nature 410 (2001) 1070–1073.

Boolchand, P.; Georglev, D.G.; Goodman, B., Discovery of the Intermediate Phase in Chalcogenide Glasses, J. Opto-electronics and Advanced Materials, 3 (2001), 703.

Boolchand, P.; Selvanathan, D.; Wang, Y.; Georglev, D.G.; Brasser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweller, R.N.; Tenhover, M., Structural ordering of evaporated amorphous chalcogenide alloy films: role of thermal annealing, Diffusion amd Defect Data vol. 53–54 (1987) 415–420.

Boolchand, P.; Grothaus, J.; Bresser, W.J.; Suranyi, P., Structural origin of broken chemical order in a GeSe2 glass, Phys. Rev. B 25 (1982) 2975–2978.

Boolchand, P.; Grothaus, J.; Phillips, J.C., Broken chemical order and phase separation in GexSe1–x glasses, Solid State comm. 45 (1983) 183–185.

Boolchand, P., Bresser, W.J., Compositional trends in glass transition temperature (Tg), network connectivity and nanoscale chemical phase separation in chalcogenides, Dept. of ECECS, Univ. of Cincinnati (Oct. 28, 1999) 45221–0030.

Boolchand, P.; Grothaus, J, Molecular Structure of Melt–Quenched GeSe2 and GeS2 glasses compared, Proc. Int. Conf. Phys. Semicond. (Eds. Chadi and Harrison) 17$^{th}$ (1985) 833–36.

Bresser, W.; Boolchand, P.; Suranyl, P., Rigidity percolation and molecular clustering in network glasses, Phys. Rev. Lett. 56 (1986) 2493–2496.

Bresser, W.J.; Boolchand, P.; Suranyl, P.; de Neufville, J.P, Intrinsically broken chalcogen chemical order in stolchiometric glasses, Journal de Physique 42 (1981) C4–193–C4–196.

Bresser, W.J.; Boolchand, P.; Suranyl, P.; Hernandez, J.G., Molecular phase separation and cluster size in GeSe2 glass, Hyperfine Interactions 27 (1986) 389–392.

Cahen, D.; Gilet, J.–M.; Schmitz, C.; Chernyak, L.; Gartsman, K.; Jakubowicz, A., Room–Temperature, electric field induced creation of stable devices in CuInSe2 Crystals, Science 258 (1992) 271–274.

Chatterjee, R.; Asokan, S.; Titus, S.S.K., Current–controlled negative–resistance behavior and memory switching in bulk As–Te–Se glasses, J. Phys. D: Appl. Phys. 27 (1994) 2624–2627.

Chen, C.H.; Tai, K.L., Whisker growth induced by Ag photodoping in glassy GexSe1–x films, Appl. Phys. Lett. 37 (1980) 1075–1077.

Chen, G.; Cheng, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of SI3N4 on chemical durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300K, J. Appl. Phys. 38 (1967) 753–756.

Davis, E.A., Semiconductors without form, Search 1 (1970) 152–155.

Deamaley, G.; Stoneham, A.M.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L., Structure of Vitreous Ag–Ge–Se, J. Non–Cryst. Solids 143 (1992) 162–180.

den Boer, W., Threshold switching in hydrogenated amorphous silicon, Appl. Phys. Lett 40 (1982) 812–813.

Drusedau, T.P.; Panckow, A.N.; Klabunde, F., The hydrogenated amorphous silicon/nanodisperse metal (SIMAL) system—Films of unique electronic properties, J. Non–Cryst. Solids 198–200 (1996) 829–832.

El Bouchairi, B.; Bernede, J.C.; Burgaud, P., Properties of Ag2–xSe1+x/n–SI diodes, Thin Solid Films 110 (1983) 107–113.

El Gharras, Z.; Bourahla, A.; Vautier, C., Role of photoinduced defects in amorphous GexSe1–x photoconductivity. J. Non–Cryst. Solids 155 (1993) 171–179.

El Ghrandi, R.; Calas, J.; Galibert, G.; Averous M., Silver photodissolution in amorphous chalcogenide thin films, Thin Solid Films 218 (1992)259–273.

El Ghrandi, R.; Calas, J.; Galibert, G., Ag dissolution kinetics in amorphous GeSe5.5 thin films from "in situ" resistance measurements vs time, Phys. Stat. Sol. (a) 123 (1991) 451–460.

El–kady, Y.L., The threshold switching in semiconducting glass Ge21Se17Te62, Indian J. Phys. 70A (1996) 507–516.

Elliott, S.R., A unified mechanism for metal photodissolution in amorphous chalcogenide materials, J. Non–Cryst. Solids 130 (1991) 85–97.

Elliot, S.R., Photodissolution of metals in chalcogenide glasses: A unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El–Zahed, H.; El–Korashy, A., Influence of composition on the electrical and optical properties of Ge20BixSe80–x films, Thin Solid Films 376 (2000) 236–240.

Fadel, M., Switching phenomenon in evaporated Se–Ge–As thin films of amorphous chalcogenide glass, Vacuum 44 (1993) 851–855.

Fadel, M.; El–Shair, H.T., Electrical, thermal and optical properties of Se75Ge7Sb18, Vacuum 43 (1992) 253–257.

Feng, X. ;Bresser, W.J.; Boolchand, P., Direct evidence for stiffness threshold in Chalcogenide glasses, Phys. Rev. Lett. 78 (1997) 4422–4425.

Feng, X.; Bresser, W.J.; Zhang, M.; Goodman, B.; Boolchand, P., Role of network connectivity on the elastic, plastic and thermal behavior of covalent glasses, J. Non–Cryst. Solids 222 (1997) 137–143.

Fischer–Colbrie, A.; Blenenstock, A.; Fuoss, P.H.; Marcus, M.A., Structure and bonding in photodiffused amorphous Ag–GeSe2 thin films, Phys. Rev. B 38 (1988) 12388–12403.

Fleury, G.; Hamou, A.; Viger, C.; Vautier, C., Conductivity and crystallization of amorphous selenium, Phys. Stat. Sol. (a) 64 (1981) 311–316.

Fritzsche, H. Optical and electrical energy gaps in amorphous semiconductors, J. Non–Cryst. Solids 6 (1971) 49–71.

Fritzsche, H., Electronic phenomena in amorphous semiconductors, Annual Review of Materials Science 2 (1972) 697–744.

Gates, B.; Wu, Y.; Yin, Y.; Yang, P.; Xia, Y., Single–crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013–1018.

Guin, J.–P.; Rouxel, T.; Karyvin, V.; Sangieboeuf, J.–C.; Serre, I.; Lucas, J., Indentation creep of Ge–Se chalcogenide glasses below Tg: elastic recovery and non–Newtonian flow, J. Non–Cryst. Solids 298 (2002) 260–269.

Guin, J.–P.; Rouxel, T.; Sangleboeuf, J.–C.; Melscoet, I.; Lucas, J., Hardness, toughness, and scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the structure and electrical properties of As–Se–Cu glasses, J. Apply. Phys. 54 (1983) 1950–1954.

Hajto, J.; Rose, M.J.; Osborne, I.S.; Snell, A.J.; Le Comber, P.G.; Owen, A.E, Quantization effects in metal/a–SI:H/metal devices, Int. J. Electronics 73 (1992) 911–913.

Hajto, J.; Hu, J.; Snell, A.J.; Turvey, K.; Rose, M., DC and AC measurements on metal/a–SI:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal–a–SI:H–metal thin film structures, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan, H., Polarized memory switching in amorphous Se film, Japan, J. Appl. Phys. 13 (1974) 1163–1164.

Hegab, N.A.; Fadel, M.; Sedeek, K., Memory switching phenomena in thin films of chalcogenide semiconductors, Vacuum 45 (1994) 459–462.

Hirose, Y.; Hirose, H., Polarity–dependent memory switching and behavior of Ag dendrite in Ag–photodoped amorphous As2S3 films, J. Appl. Phys. 47 (1976) 2767–2772.

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy GexSe1–x around the stiffness threshold composition, J. Optoelectronics and Advanced Materials 3 (2001) 199–214.

Hu, J.; Snell, A.J.; Hajto, J.; Owen, A.E., Constant current forming in Cr/p+a–/Si:H/V thin film devices, J. Non–Cryst. Solids 227–230 (1998) 1187–1191.

Hu, J.; Hajto, J.; Snell, A.J.; Owen, A.E.; Rose, M.J., Capacitance anomaly near the metal–non–metal transition in Cr–hydrogenated amorphous Si–V thin–film devices, Phil. Mag. B 74 (1996) 37–50.

Hu, J.; Snell, A.J.; Hajto, J.; Owen, A.E., Current–Induced Instability In Cr–p+a–Si:H–V thin film devices, Phil. Mag. B 80 (2000) 29–43.

Iizima, S.; Sugl, M.; Kikuchi, M.; Tanaka, K., Electrical and thermal properties of semiconducting glasses As–Te–Ge, Solid State Comm. 8 (1970) 153–155.

Ishikawa, R.; Kikuchi, M., Photovoltaic study on the photo–enhanced diffusion of Ag in amorphous films of Ge2S3, J. Non–Cryst. Solids 35 & 36 (1980) 1061–1066.

Iyetomi, H.; Vashishta, P.; Kalla, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical condition of amorphous As2Se7 before switching, Phys. Stat. Sol. (a) 13 (1972) K105–K109.

Joullie, A.M.; Marucchi, J., Electrical properties of the amorphous alloy As2Se5, Mat. Res. Bull. 8 (1973) 433–442.

Kaplan, T.; Adler, D., Electrothermal switching in amorphous semiconductors, J. Non–Cryst. Solids 8–10 (1972) 538–542.

Kawaguchi, T.; Maruno, S.; Elliott, S.R., Optical, electrical, and structural properties of amorphous Ag–Ge–S and Ag–Ge–Se films and comparison of photoinduced and thermally induced phenomena of both systems, J. Appl. Phys. 79 (1996) 9096–9104.

Kawaguchi, T.; Masui, K., Analysis of change in optical transmission spectra resulting from Ag photodoping in chalcogenide film, Japn. J. Appl. Phys. 26 (1987) 15–21.

Kawasaki, M; Kawamura, J.; Nakamura, Y.; Aniya, M., Ionic conductivity of Agx(GeSe3)1–x (0<=x<=0.571) glasses, Solid state ionics 123 (1999) 259–269.

Kluge, G.; Thomas, A.; Klabes, R.; Grotzschel, R., Silver photodiffusion in amorphous GexSe100–x, J. Non–Cryst. Solids 124 (1990) 186–193.

Kolobov, A.V., On the origin of p–type conductivity in amorphous chalcogenides, J. Non–Cryst. Solids 198–200 (1996) 728–731.

Kolobov, A.V., Lateral diffusion of silver in vitreous chalcogenide films, J. Non–Cryst. Solids 137–138 (1991) 1027–1030.

Korkinova, Ts,N.; Andrelchin, R.E., Chalcogenide glass polarization and the type of contacts, J. Non–Cryst. Solids 194 (1996) 256–259.

Kotkata, M.F.; Afif, M.A.; Labib, H.H.; Hegab, N.A.; Abdel–Aziz, M.M., Memory switching in amorphous GeSeTl chalcogenide semiconductor films, Thin Solid Films 240 (1994) 143–146.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16–19.

Lai, M.; Goyal, N., Chemical bond approach to study the memory and threshold switching chalcogenide glasses, Indian Journal of pure & appl. phys. 29 (1991) 303–304.

Leimer, F..; Stotzel, H.; Kottwitz, A., Isothermal electrical polarisation of amorphous GeSe films with blocking Al contacts influenced by Poole–Frenkel conduction, Phys. Stat. Sol. (a) 29 (1975) K129–K132.

Leung, W.; Cheung, N.; Neureuther, A.R., Photoinduced diffusion of Ag in GexSe1–x glass, Appl. Phys. Lett. 46 (1985) 543–545.

Matsushita, T.; Yamagami, T.; Okuda, M., Polarized memory effect observed on Se–SnO2 system, Jap. J. Appl. Phys. 11 (1972) 1657–1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2–V2O5 based glasses, Journal de Physique IV 2 (1992) C2–185—C2–188.

Messoussi, R.; Bernede, J.C.; Benhida, S.; Abachi, T.; Latef, A., Electrical characterization of M/Se structures (M=NI, BI), Mat. Chem. And Phys. 28 (1991), 253–258.

Mitkova, M.; Boolchand, P., Microscopic origin of the glass forming tendency in chalcogenides and constraint theory, J. Non–Cryst. Solids 240 (1998) 1–21.

Mitkova, M.; Kozicki, M.N., Silver incorporation In Ge–Se glasses used in programmable metallization cell devices, J. Non–Cryst. Solids 299–302 (2002) 1023–1027.

Mitkova, M.; Wang, Y.; Boolchand, P., Dual chemical role of Ag as an additive in chalcogenide glasses, Phys. Rev. Lett. 83 (1999) 3848–3851.

Miyatani, S.–y., Electronic and ionic conduction in (AgxCu1–x)2Se, J. Phys. Soc. Japan 34 (1973) 423–432.

Miyatani, S.–y., Electrical properties of Ag2Se, J. Phys. Soc. Japan 13 (1958) 317.

Miyatani, S.–y., Ionic conduction in beta–Ag2Te and beta–Ag2Se, Journal Phys. Soc. Japan 14 (1959) 996–1002.

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564–569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of GexSe1–x amorphous thin films, Jap. J. App. Phys. 15 (1976) 849–853.

Narayanan, R.A.; Asokan, S.; Kumar, A., Evidence concerning the effect of topology in elecrical switching in chalcogenide network glasses, Phys. Rev. B 54 (1996) 4413–4415.

Neale, R.G.; Aseltine, J.A., The application of amorphous materials to computer memories, IEEE transactions on electron dev. Ed–20 (1973) 195–209.

Ovshinsky, S.R.; Fritzsche, H., Reversible structural transformations in amorphous semiconductors for memory and logic, Mettalurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., Photo–Induced structural and physico–chemical changes in amorphous chalcogenide semiconductors, Phil. Mag. B 52 (1985) 347–362.

Owen, A.E.; Le Comber, P.G.; Hajto, J.; Rose, M.J.; Snell, A.J., Switching in amorphous devices, Int. J. Electronics 73 (1992) 897–906.

Pearson, A.D.; Miller, C.E., Filamentary conduction in semiconducting glass diodes, App. Phys. Lett. 14 (1969) 280–282.

Pinto, R.; Ramanathan, K.V., Electric field induced memory switching in thin films of the chalcogenide system Ge–As–Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I.; Geller, I.KH.; Shemetova, V.K., Memory and threshold switching effects in amorphous selenium, Phys. Stat. Sol. (a) 44 (1977) K71–K73.

Prakash, S.; Asokan, S.; Ghare, D.B., Easily reversible memory switching in Ge–As–Te glasses, J. Phys. D: Appl. Phys. 29 (1996) 2004–2008.

Rahman, S.; Sivarama Sastry, G., Electronic switching in Ge–Bi–Se–Te glasses, Mat. Sci. and Eng. B12 (1992) 219–222.

Ramesh, K.; Asokan, S.; Sangunni, K.S.; Gopal, E.S.R., Electrical Switching in germanium telluride glasses doped with Cu and Ag, Appl. Phys. A 69 (1999) 421–425.

Rose,M.J.; Hajto,J.;Lecomber,P.G.;Gage,S.M.;Choi,W.K.; Snell,A.J.;Owen,A.E., Amorphous silicon analogue memory devices, J. Non–Cryst. Solids 115 (1989) 168–170.

Rose,M.J.;Snell,A.J.;Lecomber,P.G.;Hajto,J.;Fitzgerald, A.G.; Owen,A.E., Aspects of non–volatility in a –SI:H memory devices, Mat. Res. Soc. Symp. Proc. V 258, 1992, 1075–1080.

Schuocker, D.; Rieder, G., On the reliability of amorphous chalcogenide switching devices, J. Non–Cryst. Solids 29 (1978) 397–407.

Sharma, A.K.; Singh, B., Electrical conductivity measurements of evaporated selenium films in vacuum, Proc. Indian Natn. Sci. Acad. 46, A (1980), 362–368.

Sharma, P., Structural, electrical and optical properties of silver selenide films, Ind. J. Of pure and applied phys. 35 (1997) 424–427.

Snell, A.J.; Lecomber, P.G.; Hajto, J.; Rose, M.J.; Owen, A.E.; Osborne, I.L., Analogue memory effects in metal/a–Si:H/metal memory devices, J. Non–Cryst. Solids 137–138 (1991) 1257–1262.

Snell, A.J.; Hajto, J.;Rose, M.J.; Osborne, L.S.; Holmes, A.; Owen, A.E.; Gibson, R.A.G., Analogue memory effects in metal/a–Si:H/metal thin film structures, Mat. Res. Soc. Symp. Proc. V 297, 1993, 1017–1021.

Steventon, A.G., Microfilaments in amorphous chalcogenide memory devices, J. Phys. D: Appl. Phys. 8 (1975) L120–L122.

Steventon, A.G., The switching mechanisms in amorphous chalcogenide memory devices, J. Non–Cryst. Solids 21 (1976) 319–329.

Stocker, H.J., Bulk and thin film switching and memory effects in semiconducting chalcogenide glasses, App. Phys. Lett 15 (1969) 55–57.

Tanaka, K., Ionic and mixed conductions in Ag photodoping process, Mod. Phys. Lett B 4 (1990) 1373–1377.

Tanaka, K.; Iizima, S.; Sugl, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type I amorphous chalcogenide, J. Elect. Mat. 2 (1973) 3–15.

Thornburg, D.D., Memory switching in amorphous arsenic triselenide, J. Non–Cryst. Solids 11 (1972) 113–120.

Thornburg, D.D.; White, R.M., Electric field enhanced phase separation and memory switching in amorphous arsenic triselenide, Journal (??) (1972) 4609–4612.

Tichy, L.; Ticha, H.; Remark on the glass–forming ability in GexSe1–x and AsxSe1–x systems, J. Non–Cryst. Solids 261 (2000) 277–281.

Titus, S.S.K.; Chatterjee, R.; Asokan, S., Electrical switching and short–range order in As–Te glasses, Phys. Rev. B 48 (193) 14650–14652.

Tranchant, S.;Peytavin, S.;Ribes,M.;Flank,A.M.;Dexpert, H.;Lagarde, J.P., Silver chalcogenide glasses Ag–Ge–Se: Ionic conduction and exafs structural investigation, Transport–structure relations in fats ion and mixed conductors Proceedings of the 6th Riso International symposium, Sep. 9–13, 1985.

Tregouet, Y.; Bernede, J.C., Silver movements in Ag2Te thin films: switching and memory effects, Thin Solid Films 57 (1979) 49–54.

Uemura, O.; Kameda, Y.; Kokal, S.; Satow, T., Thermally induced crystallization of amorphous Ge0.4Se0.6, J. Non–Cryst. Solids 117–118 (1990) 219–221.

Uttecht, R.; Stevenson, H.; Sie, C.H.; Greiner, J.D.; Raghavan, K.S., Electric field induced filament formation in As–Te–Ge glass, J. Non–Cryst. Solids 2 (1970) 358–370.

Vigar, C.; Lefrancois, G.; Fleury, G., Anomalous behaviour of amorphous selenium films, J. Non–Cryst. Solids 33 (1976) 267–272.

Vodenicharov, C.; Parvanov, S.; Petkov, P., Electrode–limited currents in the thin–film M–Ge–Se–M system Mat. Chem. And Phys. 21 (1989) 447–454.

Wang, S.–J.; Mislum, G.R.; Camp, J.C.; Chen, K.–L.; Tigelaar, H.L., High–performance Metal/silicide antifuse, IEEE electron dev. Lett. 13 (1992)471–472.

Welrauch, D.F., Threshold switching and thermal filaments in amorphous semiconductors, App. Phys. Lett. 16 (1970) 72–73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971–2974.

West, W.C., Electrically erasable non–volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number <m>, in network glasses: evidence of a threshold behavior in the slope |dTg/d<m>| at the rigidity percolation threshold (<m>=2.4), J. Non–Cryst. Solids 151 (1992) 149–154.

Axon Technologies Corporation, Technology Description: *Programmable Metalization Cell(PMC)*, pp. 1–6 (Pre–May 2000).

Helbert et al., *Intralevel hybrid resist process with submicron capability,* SPIE vol. 333 Submicron Lithography, pp. 24–29 (1982).

Hilt, Dissertation: *Materials characterization of Silver Chalcogenide Programmable Metalization.*

Hirose et al., *High Speed Memory Behavior and Reliability of an Amorphous $As_2S_3$ Film Doped Ag.* Phys. Stat. Sol. (a) 61, pp. 87–90 (1980).

Holmquist et al., *Reaction and Diffusion in Silver–Arsenic Chalcogenide Glass Systems,* 62 J, Amer. Ceram. Soc., No. 3–4, pp. 183–188 (Mar.–Apr. 1979).

Huggett et al., Development of silver sensitized germanium selenide photoresist by reactive sputter etching in SF6, 42 Appl. Phys. Lett., No. 7, pp. 592–594 (Apr. 1983).

Kawaguchi et al., *Mechanism of photosurface deposition,* 164–166 J. Non–Cryst. Solids, pp. 1231–1234 (1993).

Kolobov et al., Photodoping of amorphous chalcogenides by metals, Advances in Physics, 1991, vol. 40, No. 5, pp. 625–684.

Kozicki et al., Silver incorporation in thin films of selenium rich Ge–Se glasses, International Congress on Glass, vol. 2, Extended Abstracts, Jul. 2001, pp. 8–9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes in Metal–Doped Chalcogenides, Electrochemical Society Proceedings, vol. 99–13, 1999, pp. 298–309.

Kozicki et al., Nanoscale effects in devices based on chalcogenide solid solutions, Superlattices and Microstructures, vol. 27, No. 516, 2000, pp. 485–488.

Kozicki et al., Nanoscale phase separation in Ag–Ge–Se glasses, Microelectronic Engineering 63 (2002) pp. 155–159.

McHardy et al., The dissolution of metals in amorphous chalcogenides and the effects of electron and ultraviolet radiation, 20 J. Phys. C.: Solid State Phys., pp. 4055–4075 (1987).

Owens et al., Metal–Chalcogenide Photoresists for High Resolution Lithography and Sub–Micron Structures, Nanostructure Physics and Fabrication, pp. 447–451 (M. Reed ed. 1989).

Shimizu et al., *The Photo–Erasable Memory Switching Effect of Ag Photo–Doped Chalcogenide Glasses,* 46 B. Chem Soc. Japan, No. 12, pp. 3662–3365 (1973).

\* cited by examiner

US 6,847,535 B2

REMOVABLE PROGRAMMABLE CONDUCTOR MEMORY CARD AND ASSOCIATED READ/WRITE DEVICE AND METHOD OF OPERATION

FIELD OF THE INVENTION

The invention relates to non-volatile memory devices using programmable conductor random access memory (PCRAM) arrays.

BACKGROUND OF THE INVENTION

There is a trend toward use of removable non-volatile memory devices such as flash memory devices in digital cameras and other devices which benefit from removable non-volatile memory. Conventional non-volatile memory devices typically have limited density, high manufacturing cost, and high power consumption. A lower cost alternative to flash and other conventional removable non-volatile memory devices is desirable.

SUMMARY

In one aspect, the invention provides a programmable conductor random access memory (PCRAM) apparatus and method of operation which uses a removable PCRAM memory card comprising a programmable conductor material, e.g. a chalcogenide glass, layer containing a plurality of data storing memory elements. A housing into which the card can be inserted contains a read/write assembly containing conductive elements which define and/or align with previously defined memory elements of the card. The conductive elements are in removable contact with the memory cells of the card and are used to read and write data from and to the memory elements of the card.

The invention also provides a removable card formed of a programmable conductor material, e.g. chalcogenide glass, which can be used with a read/write assembly to define and program memory elements within the programmable conductor material.

The invention also provides a removable memory card formed of a programmable conductor material, e.g. a chalcogenide glass, which has a plurality of memory elements defined therein and which can be used for temporary or permanent storage and in which both temporary and permanent storage cells can simultaneously coexist on the same memory card.

BRIEF DESCRIPTION OF THE DRAWING

The foregoing and other features and advantages of the invention will become more apparent from the detailed description of the exemplary embodiments of the invention given below in connection with the accompanying drawings in which.

DETAILED DESCRIPTION

Figure 1:
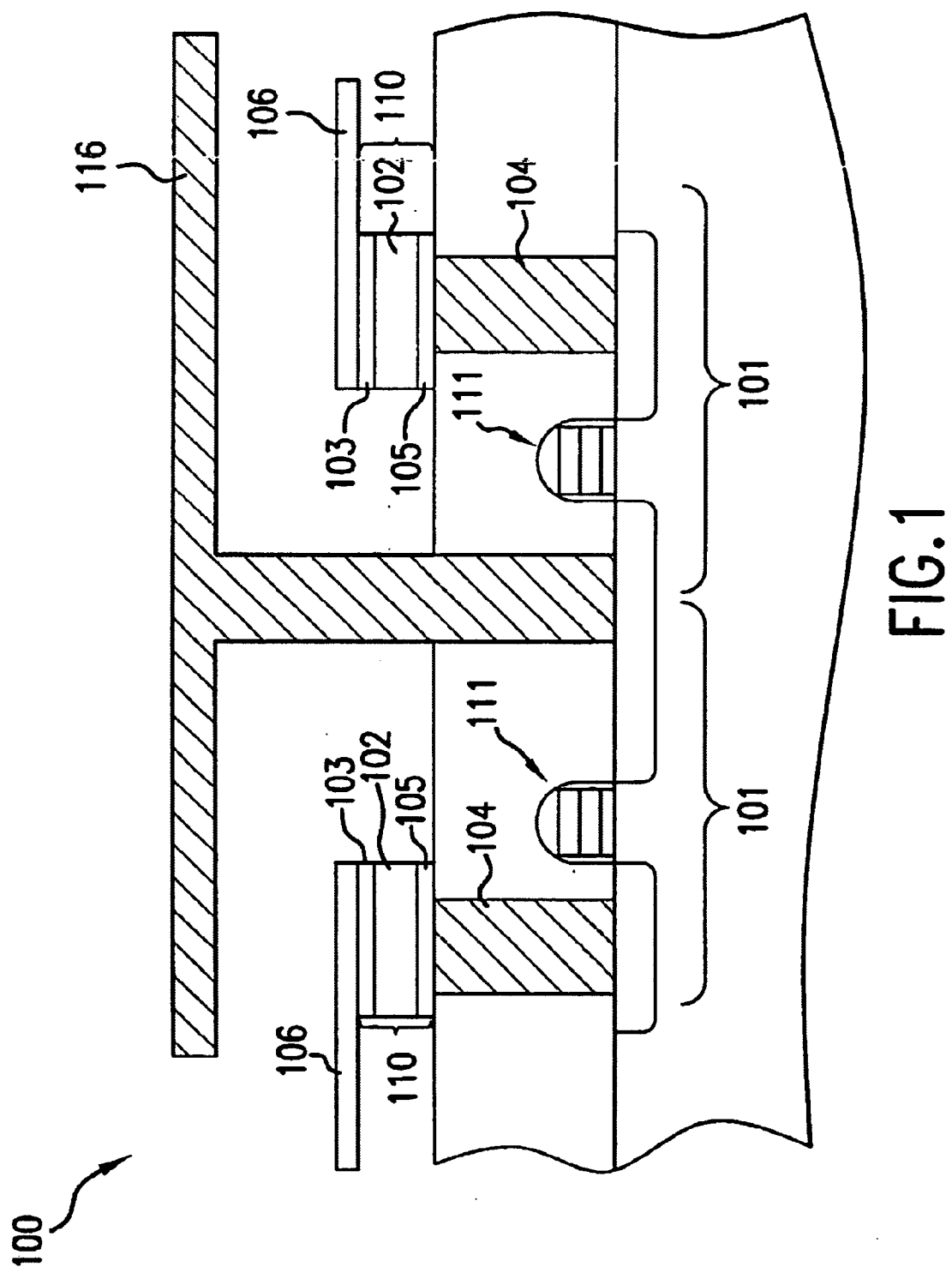
FIG. 1 is a schematic diagram depicting an proposed PCRAM device.

FIG. 1 shows one proposed PCRAM semiconductor memory structure which is based on a DRAM memory cell architecture. A brief description of this proposal is deemed helpful in understanding tie invention. As shown in FIG. 1, a memory structure 100 formed by a pair of memory cells 101 are connected to a common bit line 116 through a pair of access transistors 111. Each memory cell 101 includes a programmable conductor material layer 102, having upper 103 and lower 105 electrodes. The programmable conductor material layer has a resistance state which can change between two different values with appropriate voltage applied to the upper 103 and lower 105 electrodes. One suitable and exemplary programmable conductor material for layer 102 is a chalcogenide glass, for example a Ge:Se glass having about 20%–30% germanium and 70%–80% selenium, which is doped with silver.

The lower electrodes 105 are connected to tungsten plugs 104. The upper electrodes 103 are commonly connected to a cell plate 106. The arrangement is similar to that used in a conventional DRAM, except that the cell capacitors normally provided in a DRAM are replaced by the programmable conductor memory element 110 formed by the programmable conductor material layer 102 and the upper 103 and lower 105 electrodes. For purposes of simplifying further discussion, the programmable conductor material layer will be assumed to be a doped chalcogenide glass layer, but it should be understood that any programmable conductor material can be used.

Normally the programmable conductor glass memory element 110 is in a higher resistance state, but it can be programmed to a lower resistance state by application of a suitable voltage across memory element 110. Access transistors 111 are connected to separate wordlines (not shown) which are activated to couple the memory elements 110 to the bit line 116, and thereby apply suitable voltages across the memory element 110 for both programming the memory element to a lower resistance state as well as erasing a memory element back to a higher resistance state.

The lower resistance state of the memory elements 110 may occur due to the growth of a conductive dendrite within or on the surface of the chalcogenide glass layer 102 by the voltage applied to the conductors 103, 105. This dendrite is non-volatile in that it remains when the voltage across the cell 101 is removed.

The lower resistance state of the memory element 110 may occur due to the fact that the cell 101 has grains or quantum dots which span the upper 103 and lower 105 electrodes of the cell 101. These grains may or may not be metallic in content. When a potential is applied across the cell 101, metal ions migrate into these structures and lower the resistivity of the cell 101 by clustering in/on the grains and ultimately connecting the grains. A reversal in the potential across the cell 100 essentially pushes the metal ions out of these grains, thus increasing the resistance of the cell 101. Thus, to return the cell 101 to a higher resistance state a reverse voltage at least equal to the program voltage required to program the cell 101 to a lower resistant state is applied across the conductors 103, 105.

A memory element 110 is typically read by applying a voltage across it which is less than that required for writing the memory element 110 to a lower resistance state. This read voltage is discharged through the resistance of the memory element 110 and the discharging voltage is read at some point to determine the high or low resistance state of the memory element 110 and thus a stored binary value.

Although FIG. 1 illustrates an exemplary architecture useful for explaining how a programmable conductor memory element 110 works, the representation shown in FIG. 1 is for illustration only, as many different other arrangements for reading and writing a programmable conductor memory element may be employed. In addition, the particular arrangement in which the memory element 110 receives voltages from bit line 116 through access transistor 111 and cell plate 106 may also change.

Figure 2A:
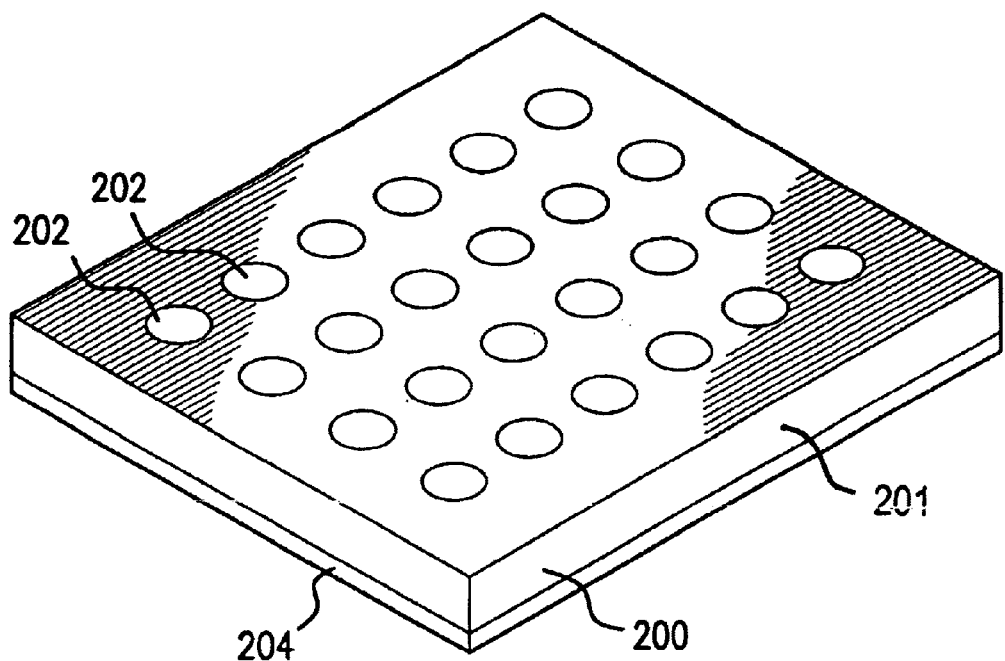
FIG. 2A and FIG. 2B depict PCRAM memory cards which are employed in the invention.

The present invention utilizes the overall memory cell 101 architecture shown in FIG. 1, but rearranges the programmable memory elements in a manner which provides the memory elements 110 in one or more arrays on a removable memory card 200. Thus, FIG. 2A shows a programmable conductor material card 200, which is provided with an array of PCRAM memory elements 202. In an exemplary embodiment, the programmable conductor card 200 is formed (at least partially) of a chalcogenide glass which has between 20%–30% germanium and between 70%–80% selenium and is doped with silver. The card 200 may have a conductor 204 provided on one surface; the conductor 204 may be formed of a metal such as tungsten.

The card 200 is passive in that it does not contain any access transistors, bit lines or wordlines, but is dedicated to the programmable conductor material 201 in which areas (e.g., 202) are available for use as memory cells. It should be noted that although FIG. 2A shows a regular array of memory elements 202, the locations of memory elements 202 need not be predefined in the memory card 200, but can instead be defined by the locations on memory card 200 where conductive elements (301) of a read/write assembly 358, described in relation to FIG. 4 below, are located relative to the memory card 200.

Figure 2B:
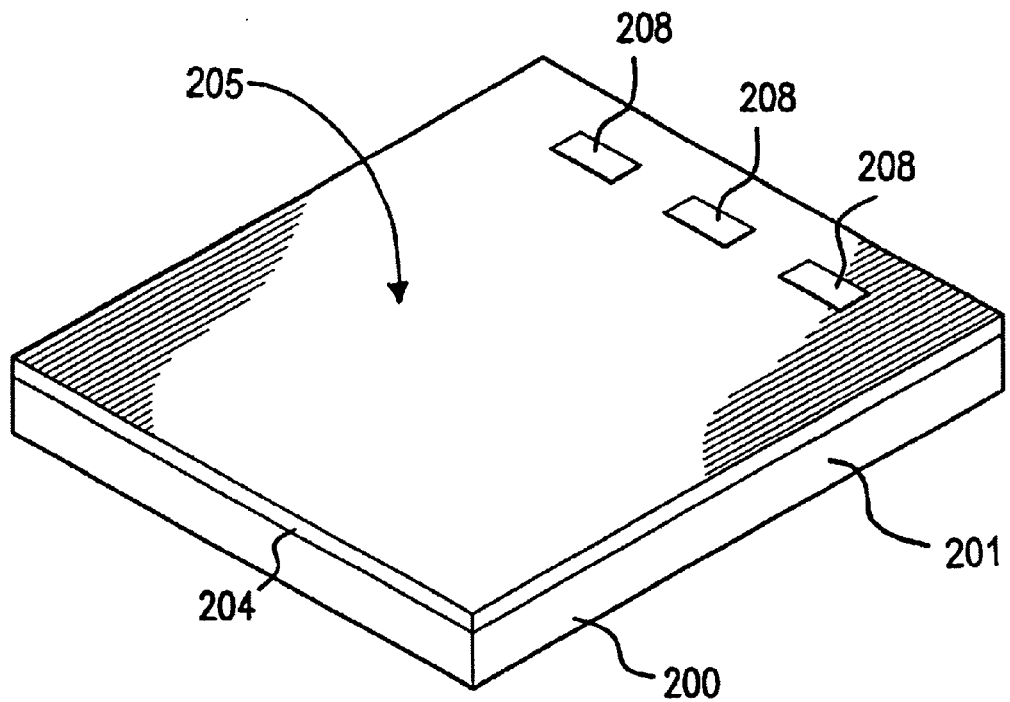

Another characteristic of one embodiment of a memory card 200, shown at FIG. 2B, is that the back side 205 contains a plurality of slots 208. These slots 208 are formed as recesses or depressions within the memory card 200 for alignment and locking purposes, as will be described below with respect to the read/write device shown in FIG. 3A and FIG. 3B.

Figure 3A:
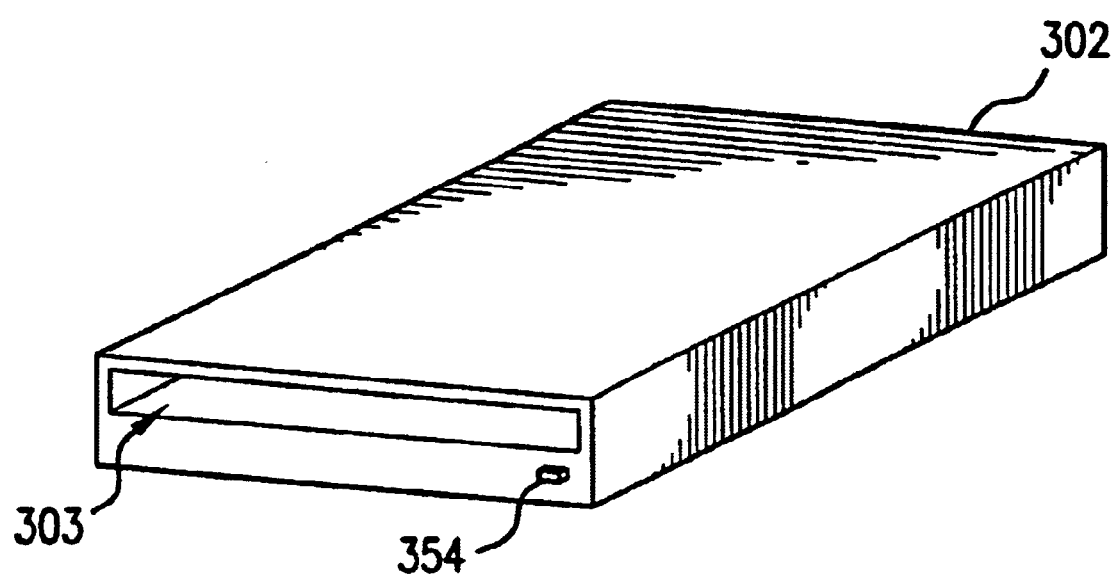
FIGS. 3A and 3B respectively illustrate a perspective view and cutaway side view of a card reading and writing device which may be used with the FIG. 2A and FIG. 2B memory card.
Figure 3B:
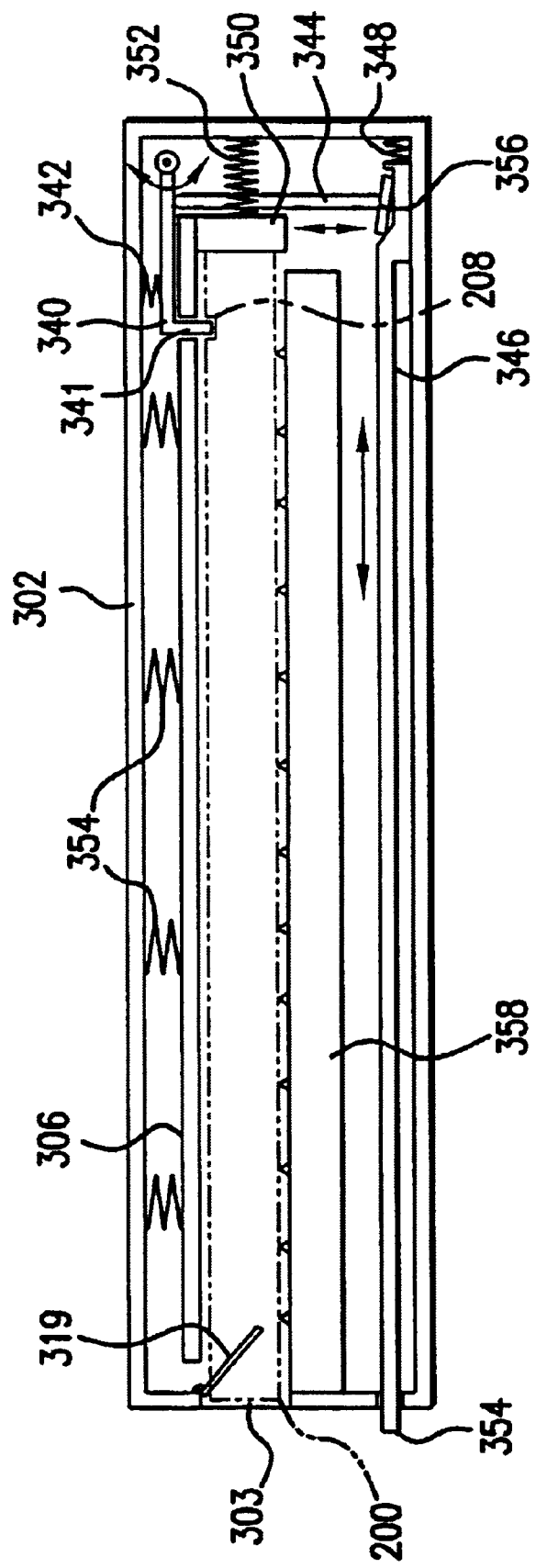

In order to define the locations of the PCRAM elements 202 in the memory card 200, as well as to read from and write to those memory elements 202, access transistors, bit lines and word lines of a read/write assembly necessary to operate the memory elements 202 are contained within the read/write device illustrated in FIGS. 3A and 3B.

FIG. 3A shows a device housing 302 having a front opening 303 which is designed to receive a memory card 200 (FIGS. 2A and 2B). Also illustrated on the front of housing 302 below the receiving slot 303 is a push button 354 for releasing a memory card 200 from the housing 302. The opening 303 may be provided with a door 319 (FIG. 3B), which opens when a card 200 is inserted into the housing 302 through the opening 303.

FIG. 3B illustrates in side view a cross-section of the read/write mechanism contained within housing 302. The mechanism includes an upper conductive plate 306 on one side of an opening area which receives a memory card 200. The conductive plate 306 is biased by springs 354 or other biasing means towards a read/write assembly 358 provided on an opposite side of the open area in the housing. Plate 306 has a plurality of apertures therein at a side of the housing 302 removed from opening 303. These apertures allow terminal ends of L-shaped pivot arms 340 to project through plate 306 and engage with the slots 208 on the back side 205 of a memory card 200.

Figure 10:
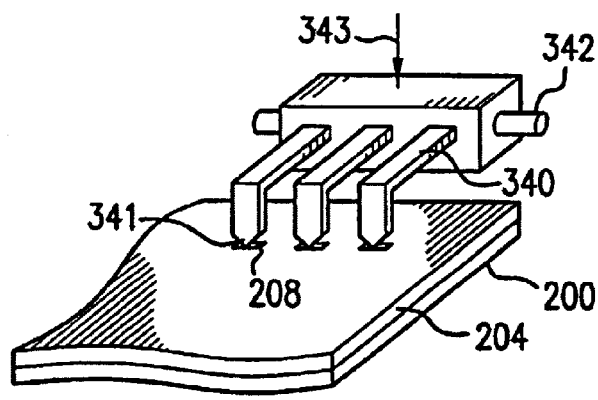
FIG. 10 is a perspective view of a portion of a locking mechanism which can be used in the invention.

The pivot arms 340 shown in greater detail in FIG. 10, partially project through the apertures in bias plate 306 (FIG. 3B). A memory card 200 inserted into housing 302 (FIGS. 3A and 3B) pushes a leading edge 341 of the pivot arms 340 upward against a biasing force 343, for example spring 342, until the card slots 208 are aligned with the leading edge 341 of pivot arms 340, in which case the biasing on the arms 340 causes the pivot arms to move into the slots 208 and lock the memory card 200 in a held and aligned position within housing 302. As shown in FIG. 3B, when inserted into housing 302, the card 200 is also pushed against an end element 350 biased by spring 352. Thus, upon insertion of the memory card 200 into the housing 302, the end of the memory card 200 pushes against end element 350 and against bias spring 352 until the pivot arms 340 lock the memory card 200 in place.

The memory card 200 can be released by pressing a button 354, which connects with a rod 346 having on one end an incline surface 356 against the bias of spring 348. By pushing on button 354, the incline surface 356 raises a rod 344 which pushes pivot arms 340 against the bias force, causing them to be withdrawn from the memory card 200. When the memory card is released by the pivot arms 340, the bias on an end element 350 causes the element 350 to push the memory card 200 partially out of opening 303, where it may be grasped and removed by a user.

Figure 4:
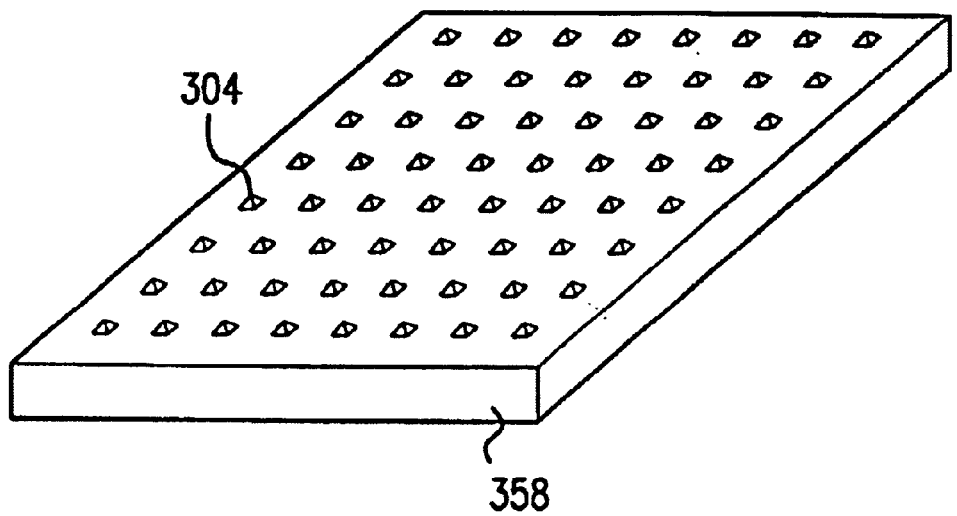
FIG. 4 illustrates in perspective view a portion of a read/write assembly which may be employed as part of the mechanism illustrated in FIG. 3B.

A read/write assembly 358 is also provided within housing 302 and is illustrated in perspective view in FIG. 4. The read/write head assembly 358 includes a plurality of upwardly projecting conductive elements 304. At shown in FIG. 5, the locations of conductive elements 304 relative to a memory card illustrated in FIG. 2A. That is, an electrical path can be established between each conductive clement 304, a portion or area of the memory card 200 formed of programmable conductor material 201 touched by the elements 304, and the common electrode 204 of the memory card 200, which is in turn connected to the common electrode 306 within the housing 302. The conductive elements 304 may be formed of silver when the programmable conductor material is a Ge:Se chalcogenide glass compilation doped with silver.

Figure 5:
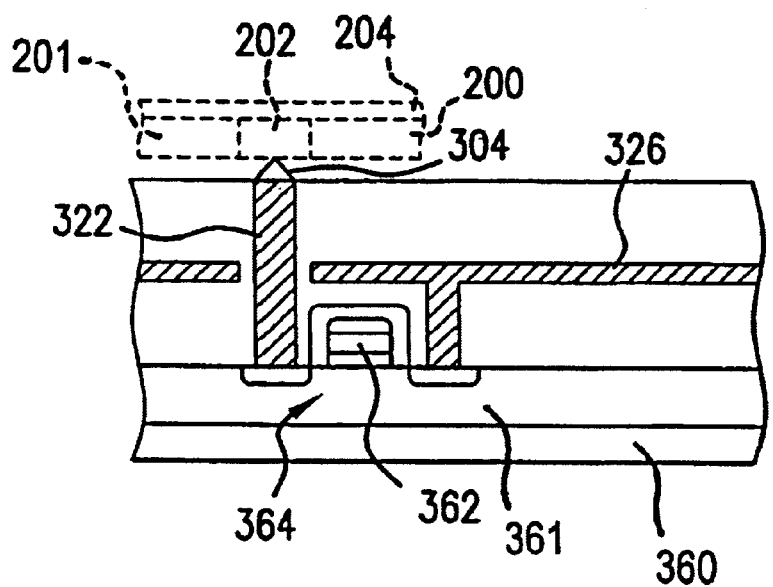
FIG. 5 represents a portion of the read/write structure illustrated in FIG. 3B.

FIG. 5 illustrates a portion of the read/write assembly 358 for a single memory element 202. The read/write assembly 358 is formed as a semiconductor structure built over a semiconductor substrate 360 containing a conductive well 361, such as a p-well. As illustrated in FIG. 5, an access transistor 364, (e.g. an n-type transistor fabricated within the p-well) is provided, which couples a bit line 326 through the access transistor 364 to a polysilicon plug 322, which connects to the conductive element 304.

As also illustrated in FIG. 5, when the memory card 200 is provided within the housing 302, each conductive element 304 can define the location of a memory element 202, with the conductive element 304 functioning as the (FIG. 1) lower electrode 105 while the memory card conductor 204 and housing 302 conductor 306 function as the (FIG. 1) upper electrode 103. Although FIG. 5 illustrates a single conductive element 304 and associated access transistor 364, it should be appreciated that this structure is repeated throughout the read/write assembly 358 and memory card 200, as shown in FIG. 4, for each memory element 202.

Figure 6:
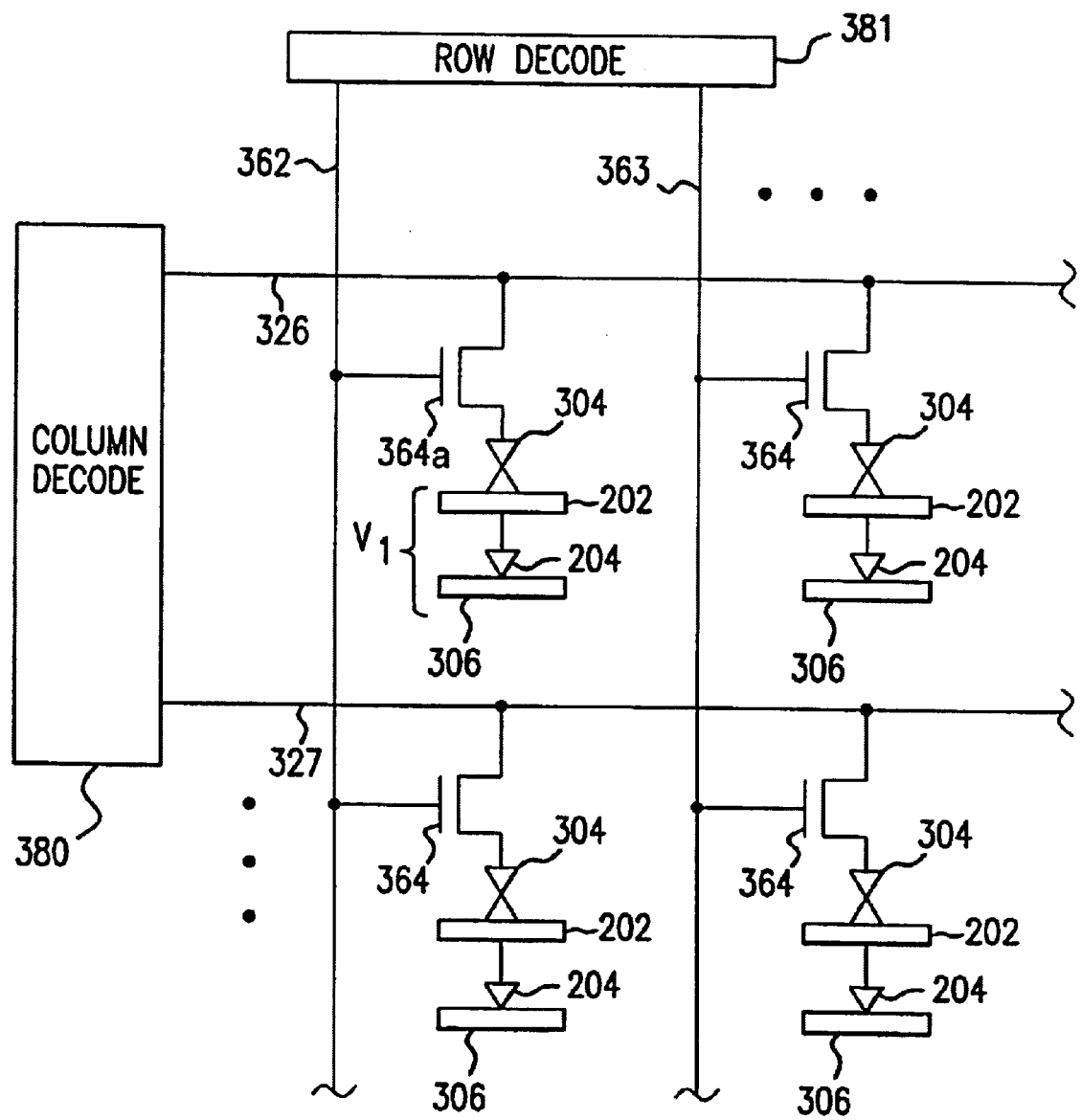
FIG. 6 illustrates in schematic form the electrical interconnection of the FIG. 5 structure with the FIGS. 2A, 2B memory card.

FIG. 6 illustrates an electrical schematic depiction of a portion of a memory array created by the contact of the read/write assembly 358 with the memory card 200. FIG. 6 also illustrates bit lines, e.g., bit lines 326, 327 connected to a column decoder 380 and row lines, e.g., 362, 363, connected between a row decoder 381, and the gates of access transistors 364. When a selected row line and bit line are activated, the access transistor 364 connected to each functions to couple an associated programmable conductor element 202 between the bit line 326 and the common plate 306. For example, if bit line 326 and row line 362 are active, an access transistor 364a connected to both couples a selected programmable bit line conductor element 202 between bit line 326 and common electrode(s) 204, 306. Thus, by providing suitable voltages on a bit line, e.g., 326, the common conductor 306 and a row line, e.g., 362, a selected memory element 202 may be read, written, and erased.

It should be noted that although the conductive elements 304 have been illustrated in the various figures as having a pointed or tipped configuration, they may in fact be constructed as rounded bumps or flat surfaces as well, the important aspect being that the conductive elements 304 provide one of the two required electrodes on opposite sides of a programmable conductor material 201 of card 200 suitable to provide, with the common electrode 204, appropriate voltages across the programmable conductor material 201 to define memory elements 202 which can read, written, and erased.

When the memory card 200 is locked into position relative to the read/write assembly 358, alignment is achieved between the card 200 and the read/write assembly 358 so that a memory card 200 which is has been programmed in one housing 302 can be removed and inserted into another like housing 302 and be properly read/written.

To further enhance the ability of the memory card 200 to be properly aligned relative to the conductive elements 304 of different read/write assemblies 358 provided in differing housings 302, it may be desirable to provide a more sophisticated control system for automatically aligning the memory card 200 with the read/write assembly 358.

Figure 7:
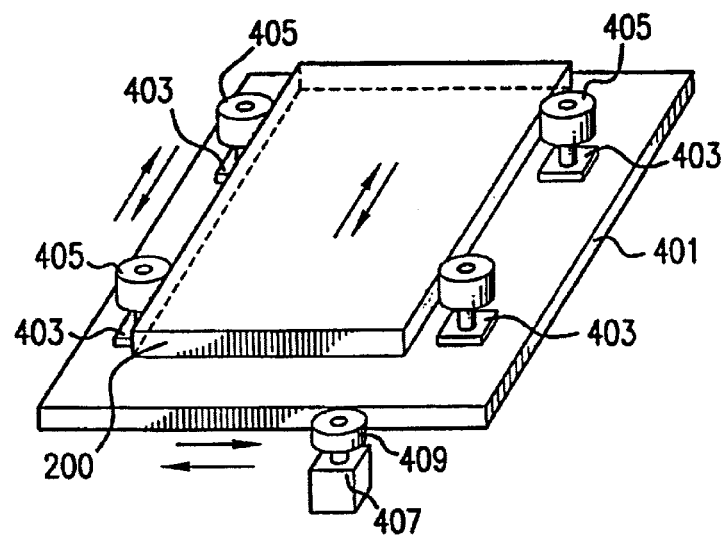
FIG. 7 illustrates another embodiment of a portion of a card read/write mechanism which receives, inserts and removes a memory card and aligns it in a particular orientation relative to a read/write assembly.
Figure 8:
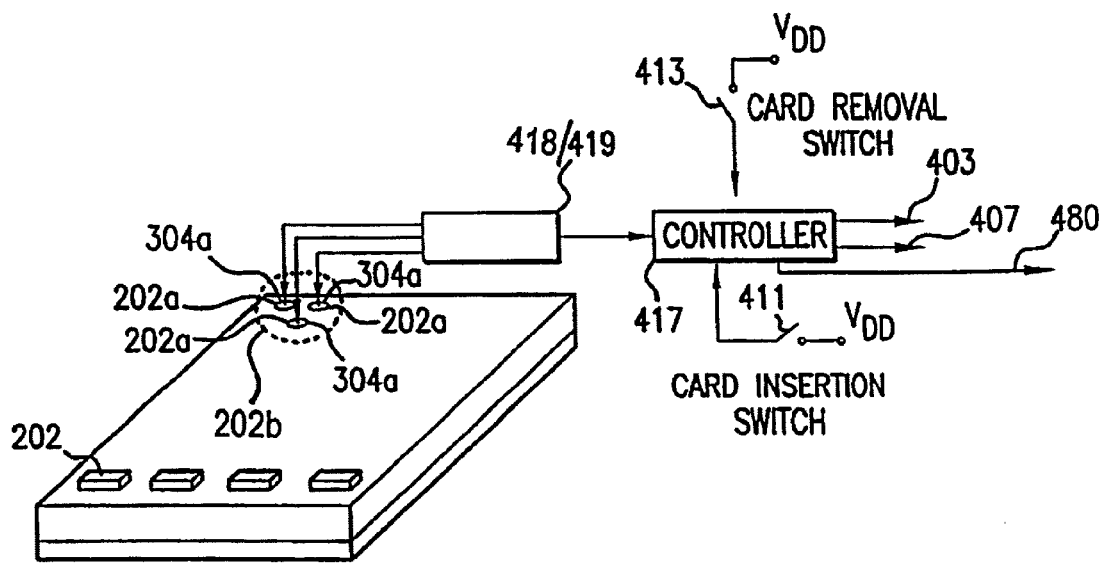
FIG. 8 illustrates a control system for use with the FIG. 7 embodiment.

FIG. 7 and FIG. 8 illustrate exemplary mechanisms which may be provided within housing 302 to provide an automatic insertion and removal of a memory card in the housing, as well as provide proper alignment of the memory card 200 relative to the read/write assembly 358. A plurality of rollers 405 (FIG. 7) may be provided on shafts, which are connected to respective motors 403. When a card 200 is inserted through opening 303 of housing 302, a card insertion switch 411 (FIG. 8) is activated to provide a signal to a controller 417, which instructs the motors 403 to grab the card 200 and drive it into the housing 302.

The controller 417 can control the motors 403 to move the card 200 in a removal as well as insertion direction as illustrated by the arrows of FIG. 7. Pushing removal button 354 in this embodiment closes a card removal switch 413, which causes controller 417 to release the card 200 by driving the rollers 405 in a card removal direction. Controller 417 can also fine tune the location of the card 200 within the housing 302 to ensure that the card 200 is properly aligned with respect to the conductive elements 304 of read/write assembly 358. This is done by controlling both the motors 403 which control the insertion and removal of the card 200, and its terminal position in the insertion/removal direction, as well as an additional motor 407 which drives a roller 409, which in turn is coupled to a frame 401 on which the motors 403 are mounted.

The frame 401 is driven by motor 407 in a lateral direction relative to the card insertion and removal direction. Thus, by appropriately controlling motor 407 as well as the motors 403, controller 417 can position an inserted card 200 in a precise longitudinal and lateral position relative to the read/write conductors 304 of the read/write assembly 358.

In addition, as shown in FIG. 8, each memory card 200 may also be provided with specific memory elements 202a arranged in a predetermined pattern 202b, which is designed to align with read/write elements 304a provided in a read/write assembly 358. The memory elements 202a, which are prerecorded with binary data, can be read when the card 200 is inserted into a housing 302, with the outputs of the memory elements 202a being provided to a decoder 419 which indicates to controller 417 when a proper alignment of the memory card 200 relative to the card read/write head assembly 358 occurs. Thus, controller 417 can appropriately drive the motors 403 and 407 until it recognizes the proper alignment pattern 202b set by the memory elements 202a and thereby position the card 200 appropriately relative to the conductive elements 304 of the read/write assembly 358. In lieu of programmed memory elements 202a, an optically readable alignment pattern 202b (which may comprises memory elements 202a) may be provided on memory card 200. If optically readable, the pattern 202b can be read by an optical reader 418 within the housing 302 to supply input signals to controller 417 which are used to produce and sense proper alignment of card 200 relative to read/write assembly 358.

The controller 417 illustrated in FIG. 8 is also arranged to provide an enable signal on line 480 when alignment is achieved between card 200 and read/write assembly 358. The enable signal is provided to control circuitry for the read/write assembly to enable operation of the read/write assembly 358.

An additional feature of the invention is the ability to store information in the memory card 200 as temporary or permanent data. For temporary data storage appropriate voltages are applied to bit lines, cell plate and gate of the access transistor of a memory cell. The voltage chosen will cause a memory element 202a, which is in an at rest higher resistance state, to be programmed to a lower resistance state. For example, for a chalcogenide glass composition of $Ge_{25}:Se_{75}$ doped with silver a voltage $V_1$ (FIG. 6) of 0.25 v across the memory element 202a may be used to program the memory element 202a to the lower resistance state. A negative voltage (e.g., $-V_1$) of the same or slightly higher magnitude can then be used to program a lower resistance cell to a higher resistance state. A voltage $V_1$ slightly less (e.g. 0.1 v) than the voltage used to write a cell to the lower resistance state can be used to read the cell.

A user has a choice of causing read/write assembly 358 to change one or more memory elements 202 from semi-volatile (re-writable) state to permanent (Read-Only Memory) state. This can be done by adjusting the write voltage upward to range between 1.5–3.0 volts for permanent storage, compared to the 0.25 volts used for semi-volatile storage. Also, some memory elements of the memory card 200 can be written permanently with the high voltage and used as a ROM, while other memory elements 202 of the same memory card 200 can be written as semi-volatile (re-writable) memory elements, or all memory elements 202 of a card 200 may be permanent storage memory elements or all memory elements 202 may be temporary storage memory elements.

Figure 9:
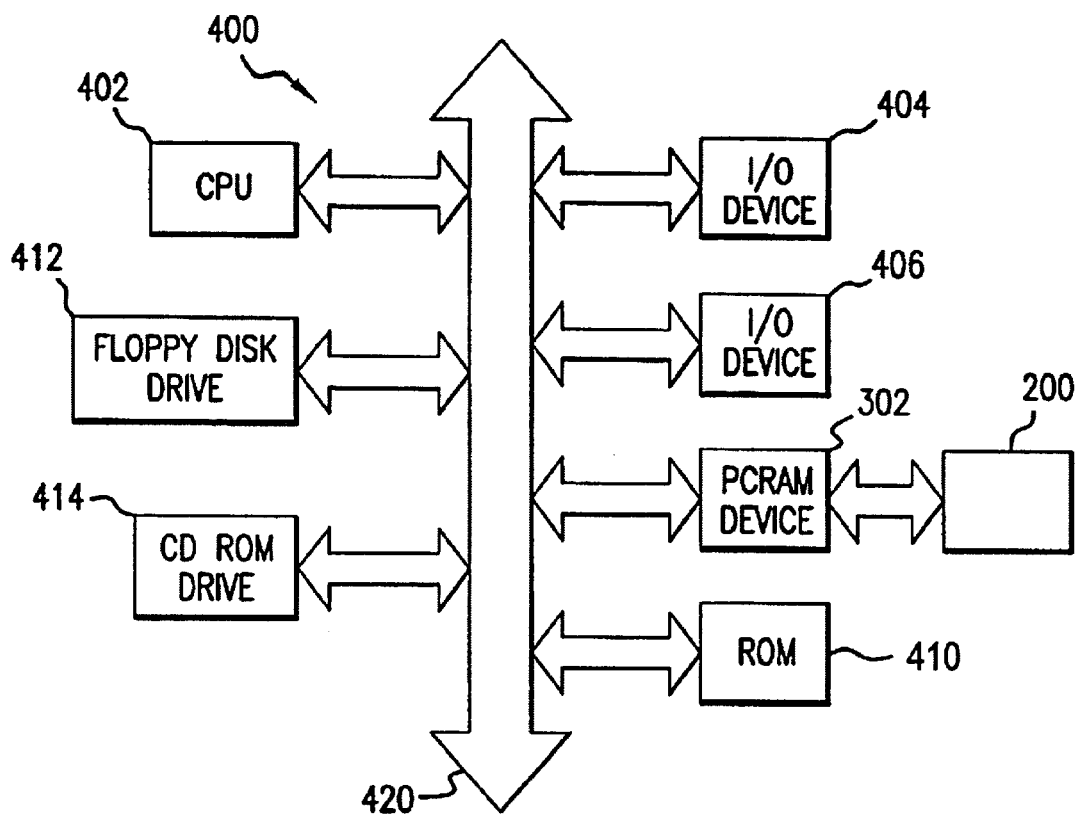
FIG. 9 shows use of the invention as part of a computer system.

FIG. 9 is a block diagram of a processor-based system 400 utilizing a removable memory card 200 constructed in accordance with the embodiments of the present invention disclosed above. The processor-based system 400 may be a computer system, a process control system or any other system employing a processor and associated memory. The system 400 includes a central processing unit (CPU) 402, e.g., a microprocessor, that communicates with the PCRAM card read/write device 302 which reads and writes to a memory card 200 and an I/O device 404 over a bus 420. It must be noted that the bus 420 may be a series of buses and bridges commonly used in a processor-based system, but for convenience purposes only, the bus 420 has been illustrated as a single bus. A second I/O device 406 is illustrated, but is not necessary to practice the invention. The processor-based system 400 also includes read-only memory (ROM) 410 and may include peripheral devices such as a floppy disk drive 412 and a compact disk (CD) ROM drive 414 that also communicates with the CPU 402 over the bus 420 as is well known in the art.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed is:

1. A programmable conductor apparatus, comprising:
    a memory card comprising a programmable conductor material capable of providing a plurality of memory storage areas; and
    a read/write assembly having a plurality of conductive elements for contacting said memory card at said plurality of memory storage locations to enable read/write operations at said memory storage areas.

2. A programmable conductor apparatus as in claim 1 further comprising a housing within which said read/write assembly is located, said housing including an opening for receiving said memory card and an internal mechanism for positioning a memory card relative to the conductive elements of said read/write assembly.

3. The apparatus of claim 1 wherein said programmable conductor material comprises a chalcogenide glass.

4. The apparatus of claim 1 wherein said memory card has predefined memory storage areas.

5. The apparatus of claim 4 wherein at least some of said predefined memory storage areas are programmed permanent memory storage areas.

6. The apparatus of claim 4 wherein at least some of said predefined memory storage areas are temporary storage areas.

7. The apparatus of claim 4 wherein at least some of said predefined memory storage areas are permanent storage areas and at least some of said predefined memory storage areas are temporary storage areas.

8. The apparatus of claim 3 wherein said chalcogenide glass comprises between 20 to 30 percent germanium and between 70 to 80 percent selenium, and is doped with silver.

9. The apparatus of claim 1 wherein said memory card further comprises a conductive layer extending over a first surface of said card, said conductive elements contacting a second opposite surface of said card.

10. The apparatus of claim 2 wherein said housing further comprises a door at said opening.

11. The apparatus of claim 1 wherein said conductive elements comprise metal elements.

12. The apparatus of claim 11 wherein said conductive elements contain silver.

13. The apparatus of claim 12 wherein said conductive elements are connected to respective access transistors through conductive polysilicon elements.

14. The apparatus of claim 1 wherein said read/write assembly further comprises an access transistor for coupling a respective conductive element to a digit line, in response to an enabling voltage provided to a word line to which a gate of said access transistor is connected.

15. The apparatus of claim 2 wherein said memory card further comprises an alignment structure and said housing further comprises an internal structure which cooperates with said alignment structure to align said memory card relative to said read/write assembly.

16. The apparatus of claim 15 further comprising a position control mechanism within said housing which senses the location of said card relative to said read/write assembly and adjusts the relative position of said memory card and read/write assembly to achieve alignment.

17. The apparatus of claim 16 wherein said alignment structure comprises a pattern of preprogrammed memory storage areas, said position control mechanism including a pattern of conductive elements for reading said preprogrammed memory storage areas and adjusting said relative position until said pattern of preprogrammed memory storage areas is properly read.

18. The apparatus of claim 16 wherein said alignment structure comprises optically readable alignment marks provided on said memory card, said position control mechanism including an optical reader for reading said optical marks.

19. The apparatus of claim 15 wherein said alignment structure comprises at least one mechanical feature on said memory card which engages with at least one mechanical element within said housing when said memory card is aligned with said read/write assembly.

20. The apparatus of claim 15 further comprising a circuit for preventing operation of said read/write assembly until alignment is achieved.

21. A memory card comprising:
    a sheet of programmable conductor material which can be programmed to define a plurality of storage areas, each having a resistance state corresponding to a stored logic value, said sheet being configured to be insertable into and removed from a card reading device.

22. A memory card of claim 21 wherein said programmable conductor material comprises a chalcogenide glass.

23. A memory card of claim 22 wherein said chalcogenide glass comprises between 20 to 30 percent germanium and between 70 and 80 percent selenium, and is doped with silver.

24. A memory card of claim 21 wherein said memory card has predefined memory storage areas.

25. A memory card of claim 24 wherein at least some of said predefined memory storage areas are programmed permanent memory storage areas.

26. A memory card of claim 24 wherein at least some of said predefined memory storage areas are temporary storage areas.

27. A memory card of claim 24 wherein at cast some of said predefined memory storage areas are permanent storage areas and at lest some of said predefined memory storage areas are temporary storage areas.

28. A memory card of claim 21 wherein said removable memory card further comprises a conductive layer extending over a first surface of said card, said conductive elements contacting a second opposite surface of said card, a second opposite surface of said card being adapted to be connected to a read/write assembly.

29. A memory card of claim 21 wherein said memory card further comprises an alignment structure for aligning said card with a read/write assembly.

30. A memory card of claim 29 wherein said alignment structure comprises a pattern of predetermined memory storage areas preprogrammed with a program code.

31. A memory card of claim 29 wherein said alignment structure comprises optically readable alignment marks.

32. A memory card of claim 29 wherein said alignment structure comprises a mechanical feature on said memory card.

33. A card read/write structure for a programmable conductor memory card, said structure comprising:
   a read/write assembly, said assembly comprising a plurality of conductive elements for respectively contacting programmable conductor storage areas of said memory card to enable read/write operations at said areas.

34. A structure of claim 33 further comprising a housing having a card entry opening, said read/write assembly being located within said housing.

35. A structure of claim 33 wherein said conductive elements comprise metal elements.

36. A structure of claim 33 wherein said conductive elements comprise silver elements.

37. A structure of claim 33 wherein said read/write assembly further comprises an access transistor for coupling a respective conductive element to a digit line, in response to an enabling voltage provided to a word line to which a gate of said access transistor is connected.

38. A structure of claim 34 further comprising an internal structure within said housing which cooperates with an alignment structure on a memory card to provide alignment of a memory card relative to said read/write assembly.

39. A structure of claim 38 further comprising a position control mechanism within said housing which senses the location of said card relative to said read/write assembly and adjusts the relative position of said memory card and read/write assembly to achieve alignment.

40. A structure of claim 39 wherein said position control mechanism includes a pattern of conductive elements at said read/write assembly for reading a program code provided at an alignment storage area of a memory card, said position control mechanism adjusting relative position of a memory card and read/write assembly until said program code is properly read.

41. A structure of claim 39 wherein said position control mechanism includes an optical reader for reading optical alignment marks on a card.

42. A structure of claim 38 wherein said internal structure comprises at least one mechanical element within said housing which engages with a least one mechanical feature on said memory card to produce alignment.

43. A structure of claim 34 further comprising a latch mechanism for holding a card within said housing.

44. A structure of claim 43 further comprising a release mechanism for releasing said latch mechanism to allow removal of a card from within said housing.

45. A method of operating a programmable conductor card, said method comprising:
   providing a memory card comprising a programmable conductor memory material;
   defining a plurality of memory storage areas with a plurality of conductive elements; and
   engaging said card with said plurality of conductive elements to read or write data from or to said memory storage areas in said memory card.

46. The method of claim 45, further comprising aligning said memory card with said plurality of conductive elements before commencing a read or write operation.

47. The method of claim 45, further comprising writing to at least one of said memory storage areas in a manner which causes temporary data storage.

48. The method of claim 45, further comprising writing to at least some of said memory storage areas in a manner which causes permanent data storage.

49. The method of claim 45, further comprising writing to at least some of said memory storage areas in a manner which causes temporary data storage and writing to some of said memory storage areas in a manner which causes permanent data storage.

50. The method of claim 46, further comprising forming an alignment structure on said memory card and aligning said memory card using said alignment structure.

51. The method of claim 50 wherein said alignment structure comprises preprogrammed memory storage areas of said card.

52. The method of claim 50 wherein said alignment structure comprises optical alignment marks.

53. A processor apparatus, comprising:
   a processor;
   a programmable conductor memory system connected to said processor, said memory system comprising:
   a read/write assembly located inside a housing and having a plurality of conductive elements for contacting respective memory storage areas of a programmable conductor material memory card at said plurality of memory storage areas to enable read/write operations at said memory storage areas;
   said housing including an opening for receiving a said memory card and an internal mechanism for positioning a received memory card relative to the conductive elements of said read/write assembly.

54. The processor apparatus of claim 53 further comprising said memory card.

55. The processor apparatus of claim 54 wherein said programmable conductor material comprises a chalcogenide glass.

56. The processor apparatus of claim 54 wherein said memory card has predefined memory storage areas.

57. The processor apparatus of claim 56 wherein at least some of said predefined memory storage areas are programmed permanent memory storage areas.

58. The processor apparatus of claim 56 wherein at least some of said predefined memory storage areas are temporary storage areas.

59. The processor apparatus of claim 56 wherein at least some of said predefined memory storage areas are permanent storage areas and at least some of said predefined memory storage areas are temporary storage areas.

60. The processor apparatus of claim 57 wherein said chalcogenide glass comprises between 20 to 30 percent germanium and between 70 to 80 percent selenium, and is doped with silver.

61. The processor apparatus of claim 54 wherein said memory card further comprises a conductive layer extending over a first surface of said card, said conductive elements contacting a second opposite surface of said card.

62. The processor apparatus of claim 53 wherein said housing further comprises a door at said opening.

63. The processor apparatus of claim 53 wherein said conductive elements comprise metal elements.

64. The processor apparatus of claim 53 wherein said conductive elements comprise silver elements.

65. The processor apparatus of claim 53 wherein said read/write assembly further comprises an access transistor for coupling a respective conductive element to a digit line, in response to an enabling voltage provided to a wordline to which a gate of said access transistor is connected.

66. The processor apparatus of claim 54 wherein said memory card further comprises an alignment structure and said housing further comprises an internal structure which cooperates with said alignment structure to align said memory card relative to said read/write assembly.

67. The processor apparatus of claim 66 further comprising a position control mechanism within said housing which senses the location of said card relative to said read/write assembly and adjusts the relative position of said memory card and read/write assembly to achieve alignment.

68. The processor apparatus of claim 67 wherein said alignment structure comprises a pattern of preprogrammed memory storage areas, said position control mechanism including a pattern of conductive elements for reading said preprogrammed memory storage areas and adjusting said relative position until said pattern of preprogrammed memory storage areas is properly read.

69. The processor apparatus of claim 67 wherein said alignment structure comprises optically readable alignment marks provided on said memory card, said position control mechanism including an optical reader for reading said optical marks.

70. The processor apparatus of claim 66 wherein said alignment structure comprises at least one mechanical feature on said memory card which engages with at least one mechanical element within said housing when said memory card is aligned with said read/write assembly.

71. The processor apparatus of claim 66 further comprising a circuit for preventing operation of said read/write mechanism until alignment is achieved.

72. A programmable resistance memory card, comprising:
 a programmable resistance material layer capable of defining a plurality of programmable memory storage areas spaced about said layer, said layer having a first surface which is electrically engageable with conductive elements of a conductor assembly for operating said memory storage areas.

73. The memory card of claim 72, further comprising:
 a bottom electrode attached to a second surface of said layer.

74. The memory card of claim 73, wherein said bottom electrode is a common electrode for said memory storage area.

75. The memory card of claim 72, wherein said memory storage areas comprise at least one of temporary and permanent memory storage.

76. The memory card of claim 72, wherein said layer comprises chalcogenite.

77. The memory card of claim 72, wherein said layer comprises between 20–30 percent germanium, between 70 and 80 percent selenium, and is doped with silver.

78. The memory card of claim 73, wherein said bottom electrode further comprises silver.

79. The memory card of claim 73, wherein said bottom electrode further comprises tungsten.

80. The memory card of claim 72, wherein said layer further comprises alignment areas.

81. The memory card of claim 80, wherein said alignment areas are formed as memory storage areas programmed with a pattern.

82. The memory card of claim 81, wherein said alignment areas are formed as alignment marks.

83. The memory card of claim 72, wherein said memory card has active circuit elements.

84. The memory card of claim 72, wherein at least some of said memory storage areas are non volatile.

85. The memory card of claim 72, wherein said first surface of said card is adapted to directly contact said conductive elements.

* * * * *

UNITED STATES PATENT AND TRADEMARK OFFICE
CERTIFICATE OF CORRECTION

PATENT NO. : 6,847,535 B2
APPLICATION NO. : 10/077784
DATED : January 25, 2005
INVENTOR(S) : Terry L. Gilton et al.

It is certified that error appears in the above-identified patent and that said Letters Patent is hereby corrected as shown below:

Title page,
Item [56], References Cited, OTHER PUBLICATIONS,
"Alekperova, Sh.M.; Gadzhleva, G.S., Current-Voltage characteristics of Ag2Se single cyrstal near the phase transition, Inorganic Materials 23 (1987) 137-139."
should read:
-- Alekperova, Sh.M.; Gadzhleva, G.S., Current-Voltage characteristics of $Ag_2Se$ single crystal near the phase transition, Inorganic Materials 23 (1987) 137-139. --.
"Elliot, S.R., Photodissolution of metals in chalcogenide glasses: A unified mechanism, J. Non-Cryst. Solids 137-138 (1991) 1031-1034.";
should read:
-- Elliott, S.R., Photodissolution of metals in chalcogenide glasses: A unified mechanism, J. Non-Cryst. Solids 137-138 (1991) 1031-1034. --.
"Tranchant, S.; Peytavin, S.; Ribes, M.; Flank, A.M.; Dexpert, H.; Lagarde, J.P., Silver chalcogenide glasses Ag-Ge-Se: Ionic conduction and exafs structural investigation, Transport-structure relation in fats ion and mixed conductors Proceedings of the 6th Riso International symposium, Sep. 9-13, 1985."
should read:
-- Tranchant, S.; Peytavin, S.; Ribes, M.; Flank, A.M.; Dexpert, H.; Lagarde, J.P., Silver chalcogenide glasses Ag-Ge-Se: Ionic conduction and exafs structural investigation, Transport-structure relation in fast ion and mixed conductors, Proceedings of the 6th Risco International symposium, Sep. 9-13, 1985. --; and
"Welrauch, D.F., Threshold switching and thermal filaments in amorphous semiconductors, App. Phys. Lett, 16 (1970) 72-73."
should read:
-- Weirauch, D.F., Threshold switching and thermal filaments in amorphous semiconductors, App. Phys. Lett. 16 (1970) 72-73. --.

Column 4,
Line 47, "At shown" should read -- As shown --;
Line 49, "card illustrated" should read -- card 200 inserted within the housing 302 define the location of the memory cells 202 illustrated --; and Column 5,
Line 45, "which is has" should read -- which has --; and

UNITED STATES PATENT AND TRADEMARK OFFICE
CERTIFICATE OF CORRECTION

PATENT NO. : 6,847,535 B2
APPLICATION NO. : 10/077784
DATED : January 25, 2005
INVENTOR(S) : Terry L. Gilton et al.

It is certified that error appears in the above-identified patent and that said Letters Patent is hereby corrected as shown below:

<u>Column 9,</u>
Line 4, "at cast" should read -- at least --; and
Line 6, "at lest" should read -- at least --.

Signed and Sealed this

Twentieth Day of June, 2006

JON W. DUDAS
*Director of the United States Patent and Trademark Office*